US010256271B1

(12) United States Patent
Hekmatshoartabari et al.

(10) Patent No.: US 10,256,271 B1
(45) Date of Patent: Apr. 9, 2019

(54) PHASE CHANGE MEMORY ARRAY WITH INTEGRATED POLYCRYSTALLINE DIODES

(71) Applicant: INTERNATIONAL BUSINESS MACHINES CORPORATION, Armonk, NY (US)

(72) Inventors: Bahman Hekmatshoartabari, White Plains, NY (US); Chung H. Lam, Peekskill, NY (US); Fabio Carta, Yorktown Heights, NY (US); Matthew J. BrightSky, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/827,238

(22) Filed: Nov. 30, 2017

(51) Int. Cl.
*H01L 27/24* (2006.01)
*H01L 21/02* (2006.01)
*H01L 45/00* (2006.01)
*G11C 13/00* (2006.01)

(52) U.S. Cl.
CPC ...... *H01L 27/2409* (2013.01); *G11C 13/0004* (2013.01); *H01L 21/0262* (2013.01); *H01L 21/02381* (2013.01); *H01L 21/02532* (2013.01); *H01L 27/2463* (2013.01); *H01L 45/06* (2013.01); *H01L 45/1616* (2013.01)

(58) Field of Classification Search
CPC ............. H01L 27/2409; H01L 21/0262; H01L 27/2463; H01L 45/1616; H01L 21/02381; H01L 21/02532; H01L 45/06; G11C 13/0004; G11C 14/0045; G11C 14/009; G11C 11/5678; G11C 17/165
See application file for complete search history.

(56) References Cited

U.S. PATENT DOCUMENTS

| 5,319,592 A | 6/1994 | Nguyen |
| 6,289,481 B1 | 9/2001 | Egawa |
| 7,883,930 B2 | 2/2011 | Tsukamoto et al. |
| 8,614,117 B2 | 12/2013 | BrightSky et al. |
| 8,766,234 B1 | 7/2014 | Hashim et al. |

(Continued)

OTHER PUBLICATIONS

Kim, C. W. et al., "59.1: Invited Paper: LTPS Backplane Technologies for AMLCDs and AMOLEDs" SID 11 Digest (Jun. 2011) pp. 862-865.

(Continued)

*Primary Examiner* — Hoang-Quan Ho
(74) *Attorney, Agent, or Firm* — Tutunjian & Bitetto, P.C.; Erik Johnson

(57) ABSTRACT

A method for deactivating memory cells affected by the presence of grain boundaries in polycrystalline selection devices includes crystallizing a semiconductor layer in a diode stack to form a polycrystalline layer for selection diodes formed in a crossbar array. To achieve a crystalline state in phase change memory elements coupled to corresponding selection diodes perform an anneal. Memory cells having shunted selection diodes due to grain boundaries are identified by scanning the array using sense voltages. A second voltage larger than the sense voltages is applied to the phase change memory elements gated by the shunted selection diodes such that the phase change memory elements gated by the shunted diodes achieve a permanently high resistive state.

16 Claims, 7 Drawing Sheets

(56) References Cited

U.S. PATENT DOCUMENTS

| | | |
|---|---|---|
| 8,809,168 B2 | 8/2014 | Bedell et al. |
| 9,136,307 B2 | 9/2015 | Pellizzer |
| 2012/0210932 A1 | 8/2012 | Hekmatshoartabari et al. |
| 2013/0286711 A1* | 10/2013 | Lung ..................... G11C 17/06 365/148 |

OTHER PUBLICATIONS

Ng, K. K. et al., "Effects of Grain Boundaries on Laser Crystallized Poly-Si MOSFETs" IEEE Electron Device Letters (Dec. 1981) pp. 316-318, vol. EDL-2, No. 12.

Baumgart, H. et al., "Grain Boundary Diffusion in Polycrystalline Silicon Films on SiO2" Journal De Physique (Oct. 1982) pp. C1-363-C1-368, Colloque C1, Supplement 10:43.

Herbst, L. et al., "Excimer Laser Advances Enable High-Performance Flat Panel Displays" Photonics Spectra (Aug. 2006) https://www.photonics.com/Article.aspx?AID=26317, Accessed on Nov. 3, 2017, pp. 1-6.

Wood, R.F. et al., "Macroscopic Theory of Pulsed-Laser Annealing. II. Dopant diffusion and segregation" Physical Review B (May 1981) pp. 5555-5569, vol. 23, No. 10.

Padilla, A. et al., "Voltage polarity effects in Ge2Sb2Te5-based phase change memory devices" Journal of Applied Physics (Sep. 2011) pp. 054501-1-054501-12, vol. 110.

Sameshima, T. et al., "Electrical Properties of Pulsed Laser Crystallized Silicon Films" Jpn. J. Appl. Phys. (Dec. 1999) pp. 1892-1897, vol. 38.

Burr, G.W. et al., "Large-scale (512kbit) integration of Multilayer-ready Access Devices based on Mixed-Ionic-Electronic-Conduction (MIEC) at 100% yield" 2012 Symposium on VLSI Technology Digest of Technical Papers (Jun. 2012) pp. 41-42.

Deng, Y. et al., "RRAM Crossbar Array With Cell Selection Device: A Device and Circuit Interaction Study" IEEE Transactions on Electron Devices (Feb. 2013) pp. 719-726, vol. 60, No. 2.

\* cited by examiner

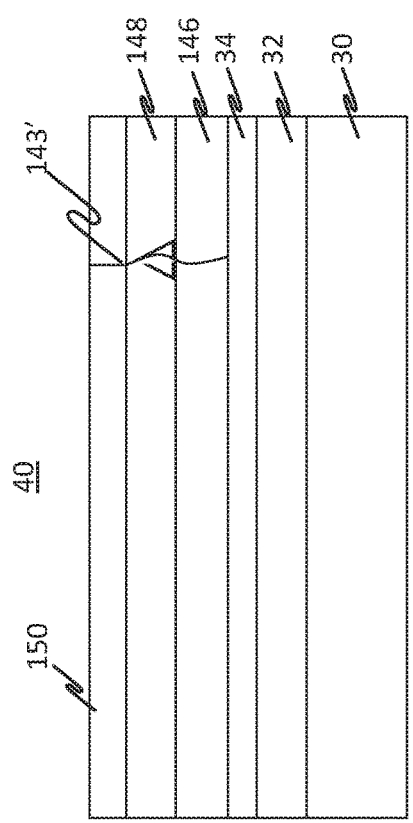
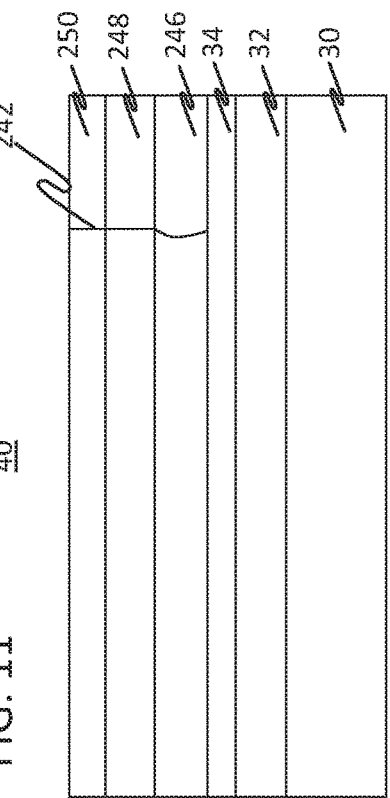
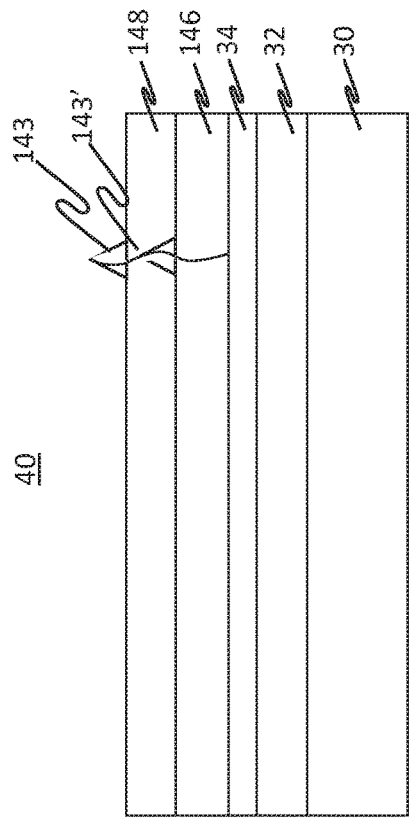
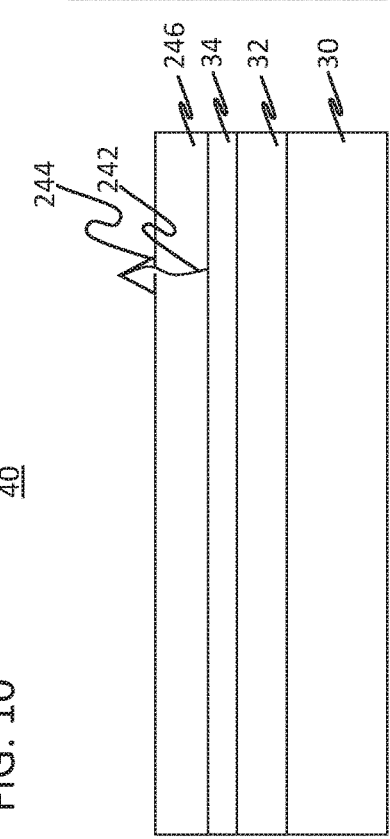

PHASE CHANGE MEMORY ARRAY WITH INTEGRATED POLYCRYSTALLINE DIODES

BACKGROUND

Technical Field

The present invention generally relates to semiconductor devices and processing, and more particularly to structures and methods that enable selective removal of memory cells affected by the presence of the grain boundaries.

Description of the Related Art

A diode has a simple structure, a small footprint and is capable of providing high drive currents. Compared to an Ovonic Threshold Switch (OTS), a diode benefits from established device physics/fabrication technology, better reliability, and high-temperature stability. However, given that a diode is a minority carrier device, its OFF characteristics may be more sensitive to grain boundary dislocations than a majority carrier device such as a field effect transistor. In addition, the presence of grain boundaries may induce device-to-device non-uniformity in the ON characteristics of the diode.

SUMMARY

In accordance with an embodiment of the present invention, a method for deactivating memory cells affected by the presence of grain boundaries in polycrystalline selection devices includes crystallizing a semiconductor layer in a diode stack to form a polycrystalline layer for selection diodes formed in a crossbar array. To achieve a crystalline state in phase change memory elements coupled to corresponding selection diodes perform an anneal. Memory cells having shunted selection diodes due to grain boundaries are identified by scanning the array using sense voltages. A second voltage larger than the sense voltages is applied to the phase change memory elements gated by the shunted selection diodes such that the phase change memory elements gated by the shunted diodes achieve a permanently high resistive state.

Another method for selective removal of phase change memory (PCM) cells affected by the presence of grain boundaries in selection diode devices in a cross-bar array includes laser treatment or other form of annealing to facilitate dopant diffusion along grain boundaries in polycrystalline material of a semiconductor layer in the selection diode stack, such that dopant diffusion across the grain boundaries creates shunts across the selection diodes affected by the presence of grain boundaries. The fabricated array is annealed at elevated temperatures to bring all PCM elements into their low resistance (crystalline) states. The locations of the memory cells having the shunted diodes are identified by scanning the array using small negative sense voltages. Large negative voltages are selectively applied to phase change memory elements gated by the shunted diodes. As a result, the phase change memory elements connected to shunted diodes obtain permanent high resistive states which cannot be altered during the normal operation of the crossbar memory array.

Another method for deactivating memory cells affected by the presence of grain boundaries in selection devices includes crystallizing a semiconductor layer in a diode stack for selection diodes formed in a crossbar array and facilitating dopant diffusion along grain boundaries to create shunts in selection diodes having grain boundaries. The location of the memory cells having shunted diodes is identified by annealing the fabricated array at elevated temperatures to achieve low resistance states in the phase change memory elements, followed by scanning the array using small sense voltages. Large negative voltages are then selectively applied to phase change memory elements gated by the shunted diodes. As a result, phase change memory elements connected to shunted diodes achieve permanent high resistive states, and the corresponding memory cells are decommissioned from use without affecting the rest of the array.

Yet another method for deactivating memory cells affected by the presence of grain boundaries in polycrystalline selection devices includes forming one or more amorphous material layers on a metal layer; crystallizing at least one of the one or more amorphous material layers to form polycrystalline material in a diode stack; facilitating dopant diffusion across grain boundaries of the polycrystalline material to create shunts across the grain boundaries; forming phase change memory material within the diode stack; forming a second contact layer on the diode stack; patterning the diode stack and the phase change memory material to form selection diodes and phase change memory elements connected between metal lines in a crossbar array; annealing to achieve a crystalline state in the phase change memory elements; identifying memory cells having shunted diodes by scanning the array using smaller negative sense voltages; and applying larger negative voltages to the phase change memory elements gated by the shunted selection diodes such that the phase change memory elements gated by the shunted diodes achieve a permanently high resistive state.

A semiconductor device includes a crossbar array including first metal lines and second metal lines transversely disposed to and electrically isolated from the first metal lines. Memory elements are coupled between the first and second metal lines, each memory element includes a diode selection device being activated in accordance with a voltage on associated first and second metal lines, the diode including polycrystalline materials for forming a diode junction; and a phase change memory element in series with the diode selection device and programmable in accordance with the diode selection device associated therewith. Decommissioned memory cells include phase change memory elements with permanent high resistive states connected in series with shunted diode selection devices.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 8 is a cross-sectional view of the partially fabricated semiconductor device of FIG. 2 having one or both of the doped amorphous layer and the intrinsic amorphous layer crystallized forming a rough surface or protrusion at a grain boundary in accordance with an embodiment of the present invention;

FIG. 9 is a cross-sectional view of the partially fabricated semiconductor device of FIG. 8 having a top rough surface planarized and a doped polycrystalline layer formed on the crystalized intrinsic layer with the grain boundary extending into the doped polycrystalline layer in accordance with an embodiment of the present invention;

FIG. 10 is a cross-sectional view of the partially fabricated semiconductor device of FIG. 2 having the doped amorphous layer crystallized forming a rough surface or protrusion at a grain boundary in accordance with an embodiment of the present invention;

FIG. 11 is a cross-sectional view of the partially fabricated semiconductor device of FIG. 10 having a top rough surface planarized and an intrinsic layer and a top doped polycrystalline layer formed on the crystalized doped layer with the grain boundary extending into the top doped polycrystalline layer in accordance with an embodiment of the present invention.

DETAILED DESCRIPTION

Figure 1:
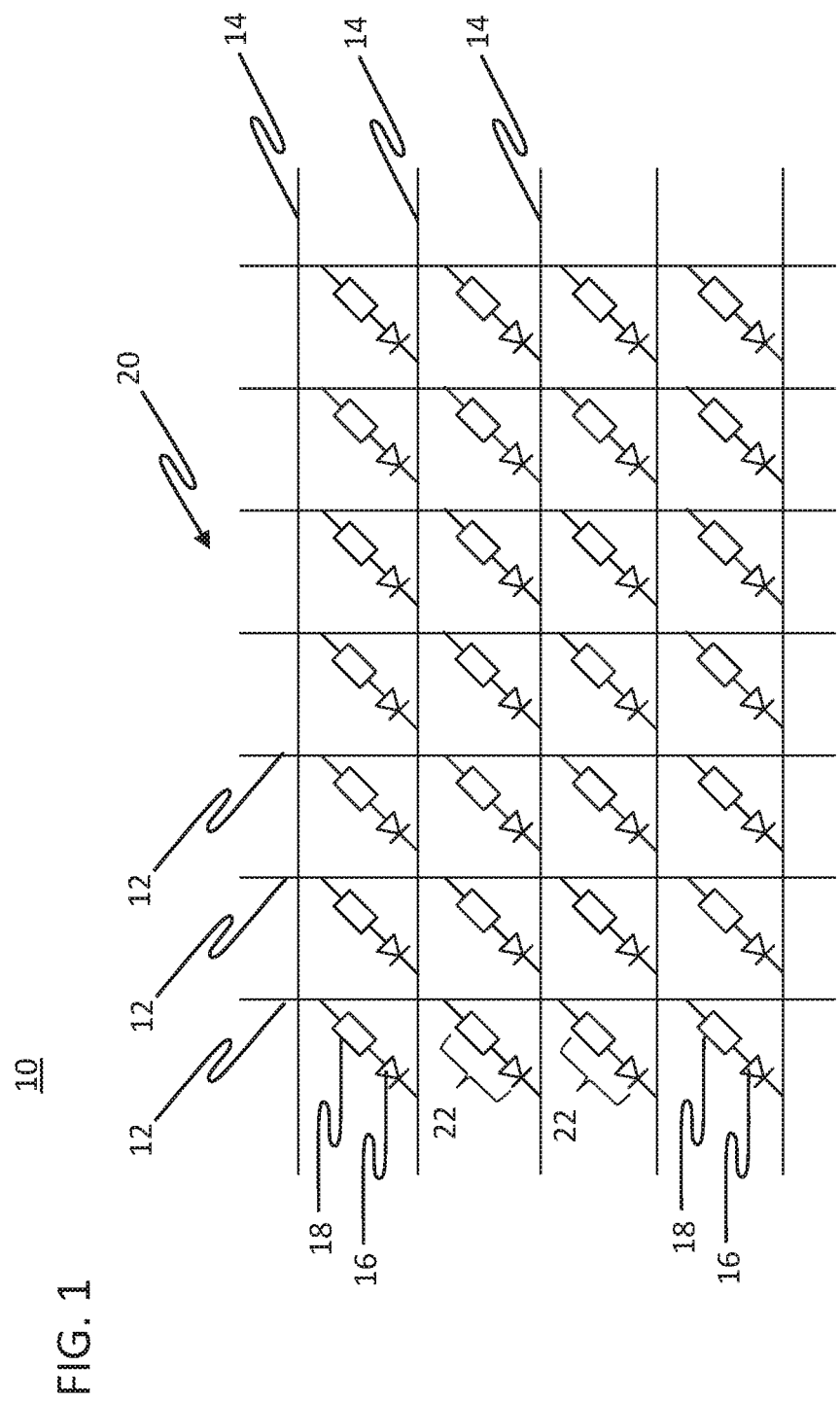
FIG. 1 is a schematic diagram showing a cross bar memory array having memory cells including phase change memory elements and selection diodes in accordance with an embodiment of the present invention.

In accordance with aspects of the present invention, structures and methods are provided that can employ diodes as selection devices. Selection devices can include a switch or configuration that permits selection of a path or state. In the present example, selection devices will be described in terms of access devices for memory cells. In particularly useful embodiments, selection devices can include diodes employed with phase change memory structures to function as memory cells. In accordance with aspects of the present invention, low-temperature polysilicon (poly-Si) (LTPS) prepared by excimer laser anneal (ELA) is a candidate for integrating diode selection devices with a phase-change memory (PCM) array. The diode has the potential to program multi-level memory cells. The PCM array with integrated LTPS-based selection diodes may be fabricated in back-end-of-line (BEOL).

To enable the advantages of polycrystalline diodes as selection devices, the adverse effects associated with grain boundaries need to be addressed in polycrystalline materials. The present embodiments enable selective removal of memory cells affected by the presence of grain boundaries. This can be achieved by facilitating enhanced dopant diffusion along the grain boundaries thus effectively shunting the selection diodes which are affected by grain boundaries. The fabricated array is annealed at elevated temperatures to bring the PCM elements into their low-resistance (crystalline) state. The locations (physical addresses) of the memory cells having shunted diodes is identified by scanning the array using a small negative sense voltage.

A large negative voltage is then selectively applied to the PCM elements connected to the shunted diodes. The large negative voltage applied to the PCM elements brings them into a high resistivity state that renders them inoperable. In one example where the grain size is approximately 1 μm (micron) and the diode diameter is about 10 nm, approximately 1% of the memory cells can be deactivated (i.e. decommissioned from use) using this technique. The remaining 99% of diodes (which do not contain grain boundaries) would benefit from uniform ON and OFF diode characteristics. In this way, the benefits of using polycrystalline diodes as BEOL-compatible selection devices can be achieved without the adverse effects of grain boundaries.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a schematic diagram shows a circuit 10 with a crossbar memory array 20. It should be understood that the circuit 10 can include additional or different components and may perform similar or completely different tasks, as described. In one embodiment, the crossbar array 20 includes a grid of transverse metal lines 12, 14. The metal lines 12 and metal lines 14 are electrically isolated from one another and are included in different planes. The metal lines 12 and metal lines 14 are connected at or near intersections by an element 22. In particularly useful embodiments, elements 22 include a diode 16 and a phase change memory (PCM) element 18.

The diode 16 can include any diode structure suitable for providing a drive current employed in programming (reading and writing data) from the PCM element 18, such as, e.g., p-n, p-i-n or Schottky junction structures. The PCM element 18 can include any phase change material, such as, e.g., combinations of Ge, Sb and Te, GeSbTe (germanium-antimony-tellurium or GST), AgInSbTe or other chalcogenide glasses employed in phase-change memory applications. GeSbTe is a ternary compound of germanium, antimony, and tellurium, with composition $Ge_2Sb_2Te_5$ commonly employed in PCM applications. Other stoichiometric variations with dopants can also be employed. To get a high data transfer rate, materials with fast crystallization speeds such as $Sb_2Te_3$ can be employed. To get long data retention, nitrogen doped $Ge_2Sb_2Te_5$ with higher crystallization temperatures can be used.

Phase change materials used in memory applications have two stable states, crystalline and amorphous. The phase change mechanism from a high resistance amorphous phase to low resistance crystalline phase in nanosecond-timescale and reversible threshold switching provide for data storage.

One characteristic that makes phase change memory useful is the ability to affect a reversible phase change when heated or cooled, switching between stable amorphous and crystalline states. When employed in phase change memory, a short, high amplitude electric pulse can be applied on metal lines 12 and/or 14 to have the material reach its melting point and be rapidly quenched to change the material from crystalline phase (ON state) to amorphous phase (OFF state). While a longer, low amplitude electric pulse permits the material to reach its crystallization point to crystallize, the phase changes from amorphous (OFF state) to crystalline (ON state). To read, a low current pulse is applied to the PCM element 18. The low current pulse ensures the sensing current does not heat up the phase change material to alter its state. Information stored is read out by measuring the resistance of the PCM element 18.

The diode 16 acts as a gate to permit the flow of current through the PCM element 18 in accordance with programming voltages on the metal lines 12 and 14. The use of a diode 16 provides sufficient programming current which may not available or would be difficult to achieve when employing transistor devices with minimum critical dimensions for high density memory applications. The diode also ensures that a thermal time constant is fast enough for the PCM element 18 to cool rapidly into the amorphous state but slow enough to permit crystallization to the crystallization state. The simple structure of diode 16 permits a small footprint making vertical integration possible.

In one embodiment, the circuit 10 implements, at least in part, a neural network or other cognitive system that simulates neurons in a biological system. A neural network stores path information that simulates learning. The resistance of the PCM elements 18 represents synaptic weights (e.g., connection path information) between neurons. The resistance of the PCM elements 18 can be altered to provide responsiveness that simulates learning. Other uses and methods can also be employed.

The diode 16 may be comprised of Si but other semiconductors such as, e.g., SiGe, Ge, III-V may also be used. High material quality is necessary for achieving diodes with high ON currents (to enable programming) and low OFF currents (to enable reading large arrays). While single-crystalline Si has a high material quality, it is not available in BEOL. Polycrystalline Si may be prepared by crystallization of amorphous Si using pulsed laser annealing. Excimer laser annealing (ELA) is particularly suited for crystallization of Si (as well as SiGe and Ge). Unlike other methods of preparing polysilicon (such as rapid thermal annealing or chemical vapor deposition), short laser pulses are used to locally anneal Si and therefore the generated heat may dissipate without damaging the BEOL metal lines. ELA may also enable 3D stacking of crossbar memory arrays, since ELA can be used to prepare polysilicon without damaging the underlying cross-bar memory arrays.

However, the presence of grain boundaries in polycrystalline materials affects the carrier transport and induces device-to-device variation in the ON and OFF characteristics of the polycrystalline devices, such as diodes 16. In particular, grain boundaries may result in significant increase of OFF current due to enhanced minority carrier recombination, therefore reducing the ON/OFF ratio of the diodes and thus limiting the size (number of cells) of the crossbar array. In addition, dopants may diffuse and travel along the grain boundaries during device fabrication further contributing to OFF current. While dopant diffusion may be minimized using techniques known in the art, e.g., by using short laser pulses and fast solidification during crystallization and minimizing thermal treatment after crystallization, the adverse effects of grain boundaries on carrier transport and particularly OFF current as described above persist.

Instead of minimizing dopant diffusion along grain boundaries, the structures and methods disclosed herein can facilitate dopant diffusion along grain boundaries to create shunts which are subsequently used as electrical pathways for applying negative bias to the phase change memory elements connected to the shunted diodes and therefore render the corresponding memory cells inoperable. As a result, the memory cells with diodes 16 affected by grain boundaries may be rendered non-programmable during normal operation of the crossbar memory array and, as such, effectively eliminated. The structures and methods disclosed herein also enable BEOL-compatible fabrication processes which may be used for 3D stacking of crossbar phase change memory arrays.

Figure 2:
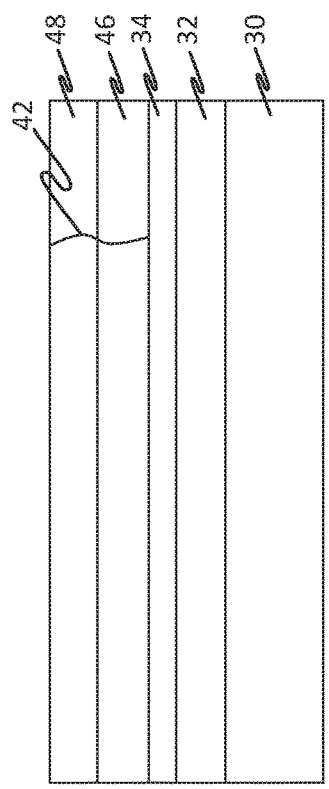
FIG. 2 is a cross-sectional view of a partially fabricated semiconductor device having a substrate, interlevel dielectric layer, metal layer, doped amorphous layer and intrinsic amorphous layer formed thereon in accordance with an embodiment of the present invention.

Referring to FIG. 2, a cross-sectional view of a semiconductor structure 40 is illustratively shown for forming diodes in accordance with aspects of the present invention. The structure 40 includes a semiconductor substrate 30. The substrate 30 can include a single material or include multiple layers. The substrate 30 can include any suitable substrate structure, e.g., a bulk semiconductor, a semiconductor-on-insulator (SOI) substrate, etc. In one example, the substrate 30 can include a silicon-containing material. Illustrative examples of Si-containing materials suitable for the substrate 30 can include, but are not limited to, Si, SiGe, SiGeC, SiC and multi-layers thereof. Although silicon is the predominantly used semiconductor material in wafer fabrication, alternative semiconductor materials can be employed instead or as additional layers, such as, but not limited to, germanium, gallium arsenide, gallium nitride, silicon germanium, cadmium telluride, zinc selenide, etc.

An interlevel dielectric layer (ILD) 32 is formed on the substrate 30 (or on intervening layers). The ILD 32 can include silicon containing materials such as $SiO_2$, $Si_3N_4$, $SiO_xN_y$, SiC, SiCO, SiCOH, and SiCH compounds, the silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon ($\alpha$-C:H). Additional choices for the interlevel dielectric layer 32 include any of the aforementioned materials in porous form, or in a form that changes during processing to or from being porous and/or permeable to being non-porous and/or non-permeable.

A metal layer 34 can be formed on the ILD 32. In some cases, the metal layer 34 can be formed through the ILD 32 in the case of vias or contacts that can be patterned into the ILD 32. The metal layer 34 can include, e.g., tungsten, titanium, ruthenium, copper, aluminum, platinum, silver, gold, alloys or these or other conductive materials, a conducting metallic compound material (e.g., tantalum nitride, titanium nitride, tungsten silicide, tungsten nitride, ruthenium oxide, cobalt silicide, nickel silicide) or any suitable combination of these materials.

A doped amorphous layer 36 is formed on the metal layer 34. In one embodiment, the doped amorphous layer 36 includes amorphous Si (a-Si), which can be deposited on the metal layer 34 using known deposition techniques. In this example, the doped amorphous layer 36 can be n+ doped. While Si is described for the device layer 36, other materials can be employed, e.g., Ge, SiC, SiGe, etc.

An intrinsic amorphous layer 38 is formed on the doped amorphous layer 36. In one embodiment, the intrinsic amorphous layer 38 includes amorphous Si (a-Si), which can be deposited on the doped amorphous layer 36 using known deposition techniques. The intrinsic amorphous layer 38 is undoped or very lightly doped. While Si is described for the device layer 38, other materials can be employed, e.g., Ge, SiC, SiGe, etc.

Figure 3:
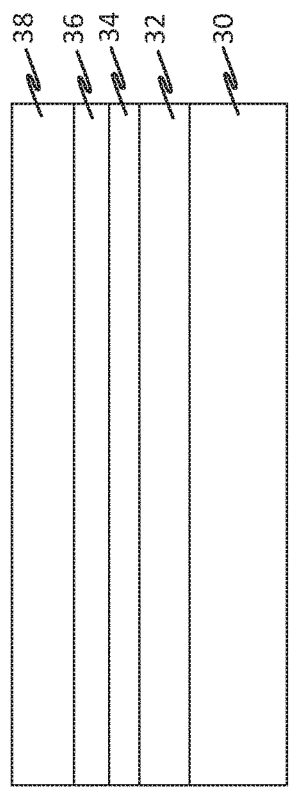
FIG. 3 is a cross-sectional view of the partially fabricated semiconductor device of FIG. 2 having one or both of the doped amorphous layer and the intrinsic amorphous layer crystallized forming a grain boundary in accordance with an embodiment of the present invention.

Referring to FIG. 3, the doped amorphous layer 36 and the intrinsic amorphous layer 38 are subjected to a crystallization process. In one embodiment, the crystallization process is performed using a BEOL-compatible laser technique, such as excimer laser anneal (ELA). The doped amorphous layer 36 is transformed to a doped polycrystalline layer 46, and the intrinsic amorphous layer 38 is transformed to an intrinsic polycrystalline layer 48. As a result of the crystallization process, one or more notable grain boundaries 42 can be formed. The grain boundaries, in this case, are sufficient to cause ill-effects on the resulting diode device to be formed.

Figure 4:
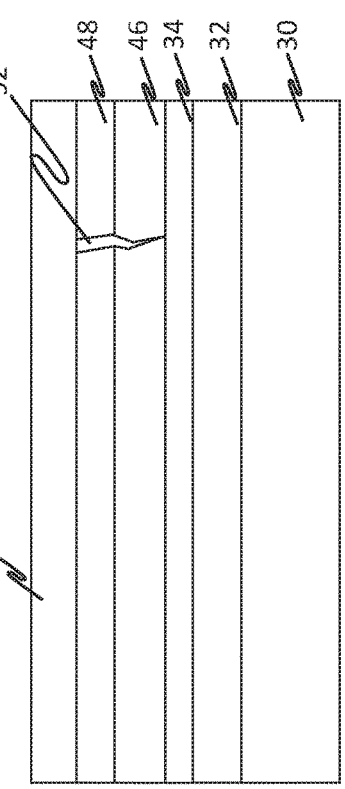
FIG. 4 is a cross-sectional view of the partially fabricated semiconductor device of FIG. 3 having a doped polycrystalline layer formed on the crystalized intrinsic layer with the grain boundary extending into the doped polycrystalline layer in accordance with an embodiment of the present invention.

Referring to FIG. 4, a doped polycrystalline layer 50 is deposited over the intrinsic polycrystalline layer 48. The intrinsic polycrystalline layer 48 can act as a seed layer to form the doped polycrystalline layer 50, e.g., in an epitaxial manner. However, the formation of the doped polycrystalline layer 50 can also propagate the grain boundary through the layer 50 to form a grain boundary 42' that passes through the doped polycrystalline layer 50. The doped polycrystalline layer 50 can include a p+ doped polysilicon that is deposited at low temperatures (since the underlying polycrystalline structure acts as a template for the crystallinity). The doped polycrystalline layer 50 can be deposited using, e.g., plasma enhanced chemical vapor deposition (PECVD), e.g. using a low-temperature process, e.g. at ~400° C. or below, which is BEOL-compatible. While Si is described for the device layer 50, other materials can be employed, e.g., Ge, SiC, SiGe, etc.

Note that all doping types described herein for may be reversed, e.g., layers 50, 48 and 46 can include p-doped-intrinsic-n-doped layers (p-i-n diode) instead of n-doped-intrinsic-p-doped layers (n-i-p diode). In addition, the present embodiments are applicable to pn junctions, np junctions and Schottky barrier devices. In Schottky barrier devices, the i-layer is optional, and one of the p and n doped layer is omitted.

Figure 5:
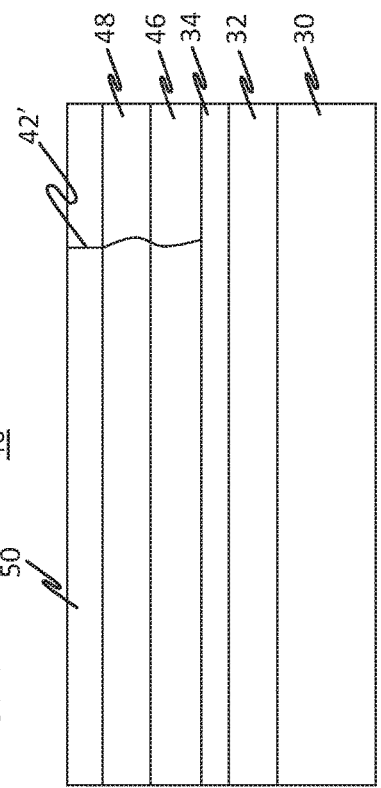
FIG. 5 is a cross-sectional view of the partially fabricated semiconductor device of FIG. 4 having the doped polycrystalline layer annealed forming a shunt through the crystalized intrinsic layer and a doped polycrystalline layer along the grain boundary in accordance with an embodiment of the present invention.

Referring to FIG. 5, the doped polycrystalline layer 50 can be annealed with pulsed laser, flash lamp, or other techniques, so that dopant diffusion across the grain boundary 42' is facilitated. If a doped amorphous material is crystallized by a pulsed laser (e.g., when doped layer 36 is crystallized to form doped layer 46), doping segregation at the grain boundaries created during laser crystallization can be negligible due to fast solidification. However, in the presence of already existing grain boundaries, e.g., grain boundary 42', doping diffusion is significantly enhanced along the grain boundaries (e.g., 10-100 times). Here, the existing grain boundary 42' creates a local shunt as a result of rapid p-type dopant diffusion from layer 50 along the grain boundary 42'. The p-type dopant diffusion and the resulting local shunt is illustrated schematically with a spark symbol 52. It should be understood that n-type dopants from layer 46 can also diffuse along the same grain boundary 42', further contributing to the local shunt.

Figure 6:
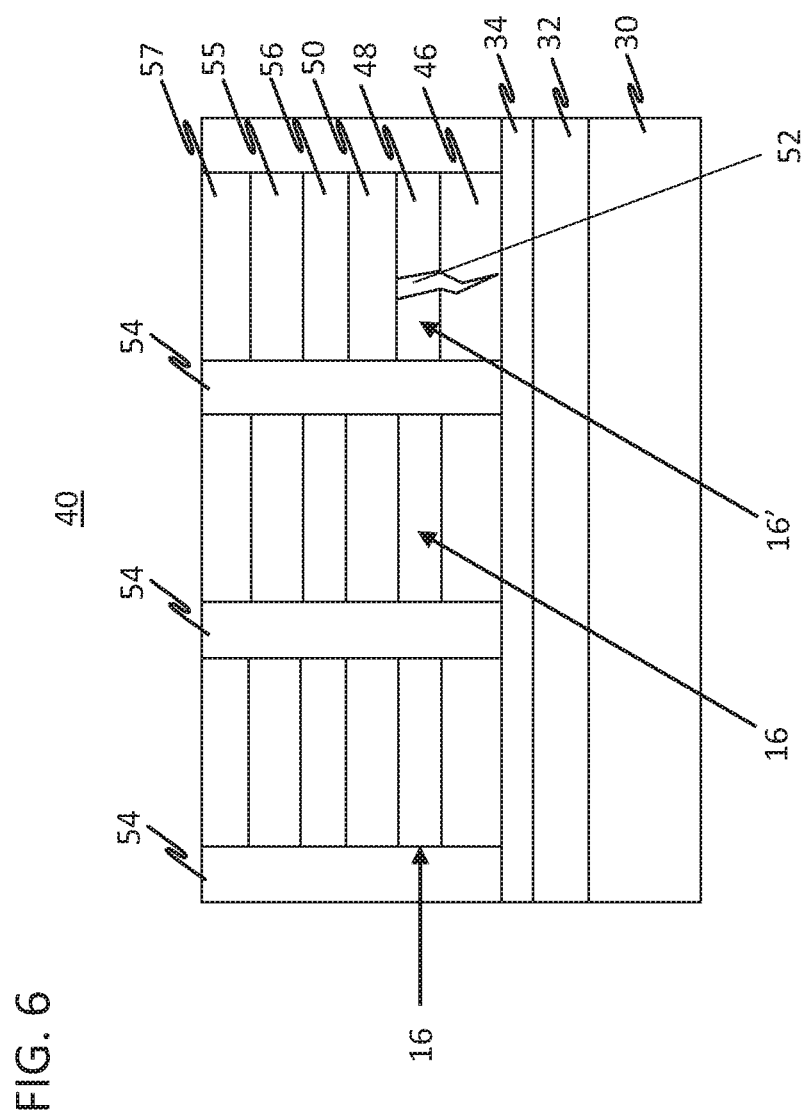
FIG. 6 is a cross-sectional view of the partially fabricated semiconductor device of FIG. 5 having selection diodes and phase change memory elements formed and passivated with and without shunts in accordance with an embodiment of the present invention.

Referring to FIG. 6, additional process steps include depositing a middle electrode 56, PCM materials (55) and contact layer (57) and patterning the diode stack to form individual devices 16 and 16', PCM elements 55 and second contacts 57. PCM elements 57 (e.g., PCM elements 18 in FIG. 1) are coupled to the diodes 16 and 16'. The middle electrode 56 may include a silicon-doped amorphous carbon layer and barrier layers such as, e.g., tungsten, tungsten nitride and the combination thereof. Other structures and compositions known in the art may also be used. The contacts 57 can be formed from the same materials as metal layer 34 of FIG. 5.

Diodes 16 are good diodes (e.g., without shunts) while diode 16' that includes the shunt 52 is a defective (shunted) diode. The diodes 16, 16' are passivated (a dielectric material 54 is formed between (and over) the devices. The diodes 16, 16' are completed along with the formation of the PCM array 20 (FIG. 1). For example, the contacts 57 can include one layer (e.g., metal lines 12 or 14) of the cross bar array 20 (FIG. 1) while layer 34 can include the other layer (e.g., metal lines 14 or 12) of the crossbar array 20 (FIG. 1).

After manufacturing, the crossbar array 20 (FIG. 1) is heated at elevated temperatures sufficient to bring all the PCM elements to their low resistance (i.e., crystalline) states. Then, the cross-bar array is scanned sequentially using a small negative sense voltage ($-V_S$) to identify the locations (row numbers and column numbers) of the cells containing shunted diodes.

Figure 7A:
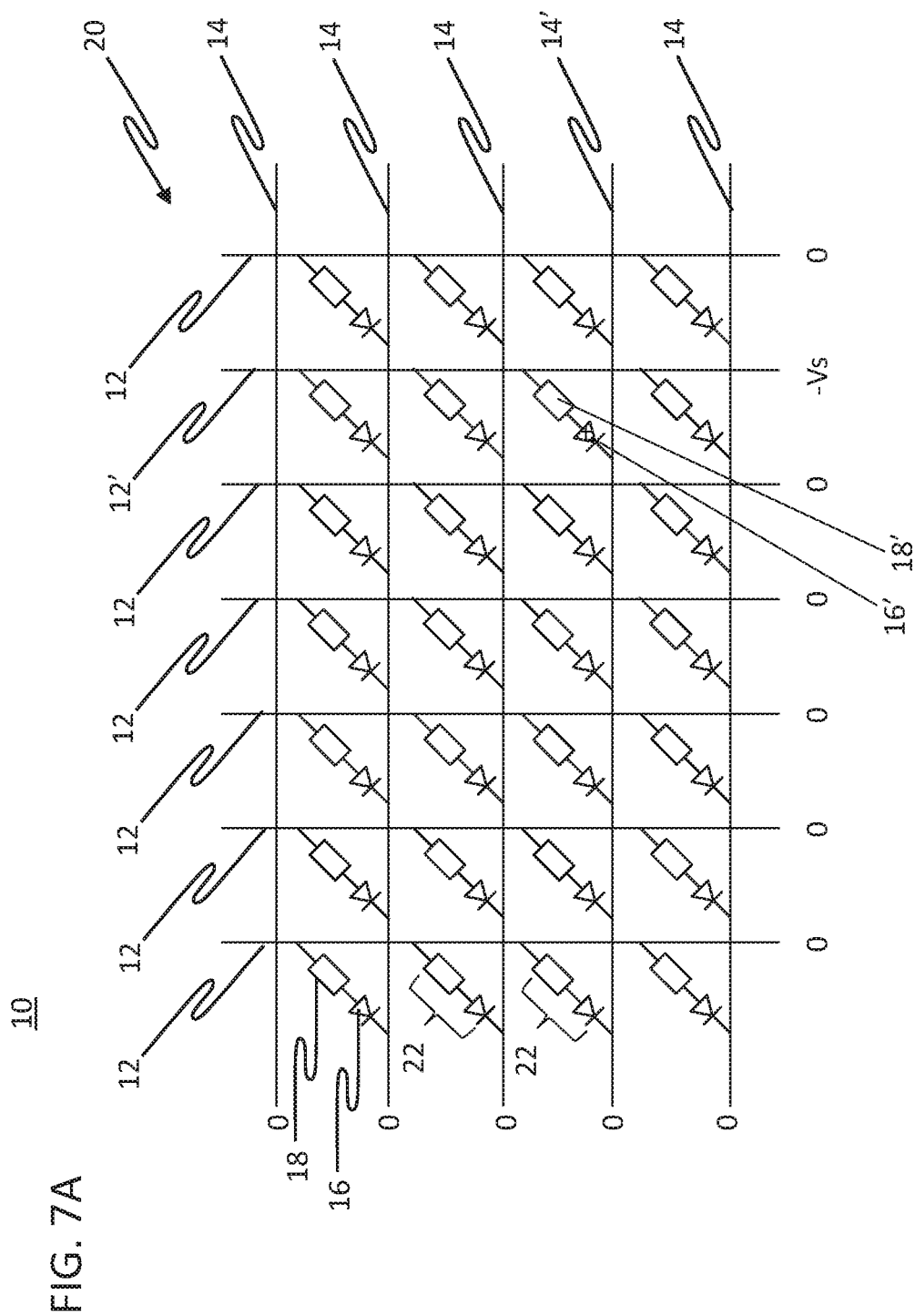
FIG. 7A is a schematic diagram showing a cross bar memory array having memory elements with diodes, phase change elements and shunted diodes with phase change elements associated with the shunted diodes identified by a sense voltage in accordance with an embodiment of the present invention.

Referring to FIG. 7A, when a memory cell with PCM element 18 and a good (un-shunted) diode 16 is selected for sensing by applying $-V_S$ on a line 12 while lines 14 are grounded (not shown in FIG. 7A), the good diode 16 is reverse biased and therefore a negligible current flows though lines 12 and 14. Other lines may also be grounded (i.e., at zero volts). When a memory cell including a PCM element 18' and a shunted diode 16' is selected for sensing by applying $-V_S$ on line 12' while line 14' is grounded, as shown in FIG. 7A, the shunted diode 16' conducts and a measurable current flows through lines 12' and 14'. Therefore, the row number of line 14' and column number of line 12' are recorded as a physical address (location) of a memory cell having a shunted diode 16'. The entire array is scanned is this manner to identify and record the locations of the memory cells including shunted diodes (16').

Figure 7B:
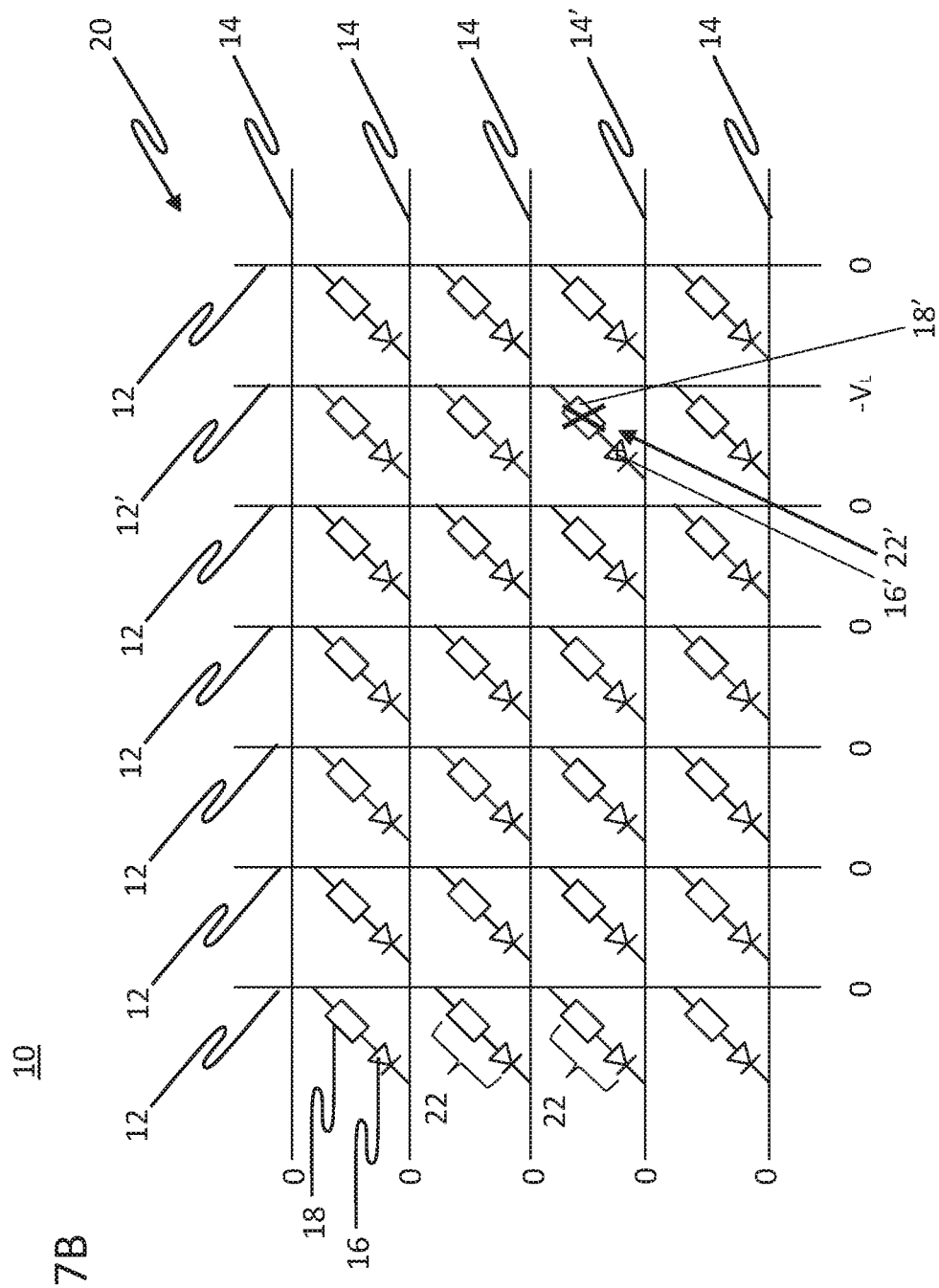
FIG. 7B is a schematic diagram showing a cross bar memory array having memory elements with diodes, phase change elements and shunted diodes with permanently high resistance phase change elements created by applying a higher voltage in accordance with an embodiment of the present invention.

Referring to FIG. 7B, a large negative voltage ($-V_L$) is applied to line 12' while line 14' is grounded. Other lines may also be grounded (i.e., at zero volts). Since the diode 16' is shunted, the voltage drop across the diode 16' is small and the voltage $-V_L$, nearly in its entirety, drops across the PCM element 18'. The magnitude and time dependence of the voltage $-V_L$ can depend on the type of diode, the materials and other characteristics of the PCM element. Negative polarity pulses that are ramped up rapidly and then ramped down rapidly can lead to phase-separation of the phase-change material and therefore create a very high resistive state in the phase-change material. In this way, the PCM element 18' achieves a permanently high resistive state, which cannot be altered during the normal operation of the crossbar array 20. The PCM element 18', once in this very high resistance state, protects the array from the leakage that would otherwise be induced by the shunted diode 16'. This corrective action is repeated for the rest of the memory cells identified to include shunted diodes 16', as described.

In some embodiments, the doped material (e.g., p+Si) of layer 50 may not be (fully) crystalline after deposition, and the annealing process (e.g. laser treatment) used for driving dopant diffusion along the grain boundaries may also crystallize (or improve the crystallinity) of the doped material of layer 50.

In some embodiments, the low-temperature doped polysilicon material grown for layer 50 may be hydrogenated, e.g., comprised of p+ c-Si:H. c-Si:H may be grown from a mixture of precursor gas $SiH_4$ (or other gases of the $Si_xH_y$ family), carrier gas $H_2$ and dopant gas, such that

[H$_2$]/[SiH$_4$]>5. For n-type doping, the dopant gas may include PH$_3$. For p-type doping, the dopant gas may include B$_2$H$_6$ or trimethylborane (TMB). The c-Si:H may have H content in the range of 5-40 atomic percent. The H content in c-Si:H may or may not be uniform. In some embodiments, the H content has a gradient towards the c-Si:H/Si interface of layers 50 and 48.

In some embodiments, the c-Si:H may further include one or more of the following compounds or elements: Deuterium (D), F, Cl, C, Ge, O, N. In some embodiments where c-Si:H includes Ge (e.g., c-SiGe:H films), Ge is introduced from a gas source, such as, GeH$_4$, such that [H$_2$]/([SiH$_4$]+[GeH$_4$])>5. c-Si:H may be deposited with PECVD at temperatures below 450° C. (preferably about 150 to about 350° C.), but other methods such as hot-wire chemical vapor deposition (HWCVD) may also be employed.

Other mechanisms can also have a deleterious effect on diode operation. For example, some preparation methods and/or conditions, e.g., one-shot ELA, may result in surface roughness and/or protrusion at grain-boundary locations. The surface roughness and/or protrusion may be removed, using chemical and/or mechanical methods, but the diodes produced can still be shunted.

The circuit 10 of FIG. 7B can be employed as a memory device with decommissioned memory cells 22' having phase change memory elements 18' with permanent high resistive states connected in series with shunted diode 16' selection devices.

Referring to FIG. 8, from the structure 40 of FIG. 1, a doped amorphous layer 36 and an intrinsic amorphous layer 38 are subjected to a crystallization process. In one embodiment, the crystallization process is performed using a laser technique. The doped amorphous layer 36 is transformed to a doped polycrystalline layer 146, and the intrinsic amorphous layer 38 is transformed to an intrinsic polycrystalline layer 148. As a result of the crystallization process, one or more notable grain boundaries includes a surface protrusion 143, which can be formed in one of or both of the doped polycrystalline layer 146 and the intrinsic polycrystalline layer 148. The surface protrusion or surface roughness in poly-Si, in this case may cause ill-effects (e.g., variation of device characteristics or high OFF current) on the resulting diode device to be formed, in addition to the ill-effects resulting from the grain boundaries.

Referring to FIG. 9, a surface planarization process (e.g., an etch or chemical mechanical polish (CMP)) can be performed to remove the surface protrusion from the layer 148; however, the protrusion in layer 146 remains as well as the grain boundary. A doped polycrystalline layer 150 is deposited over the intrinsic polycrystalline layer 148. The intrinsic polycrystalline layer 148 can act as a seed layer to form the doped polycrystalline layer 150, e.g., in an epitaxial manner. The formation of the doped polycrystalline layer 150 also propagates a grain boundary 143' through the layer 150. The doped polycrystalline layer 150 can include doped polysilicon that is deposited at low temperatures (since the underlying poly-crystalline structure acts as a template for the crystallinity). The doped polycrystalline layer 150 can be deposited using, e.g., PECVD, e.g., epitaxially, following the crystalline structure of the polycrystalline layer 148.

Layer 150 is annealed with pulsed laser, flash lamp, or other technique, so that doping diffusion along the grain boundary creates a local shunt (e.g., shunt 52 in FIG. 5).

Referring to FIG. 10, from the structure 40 of FIG. 1, a variation of the process of FIG. 8 is performed. Here, the doped amorphous layer 36 is formed but the intrinsic amorphous layer 38 is not. The doped amorphous layer 36 is subjected to a crystallization process. In one embodiment, the crystallization process is performed using a laser technique. The doped amorphous layer 36 is transformed to a doped polycrystalline layer 246. As a result of the crystallization process, one or more notable grain boundaries 242 includes a surface protrusion 244, which can be formed in the doped polycrystalline layer 146. The surface protrusion 244 or surface roughness in poly-Si, in this case, may cause additional ill-effects on the resulting diode device to be formed.

Referring to FIG. 11, a surface planarization process (e.g., an etch or CMP) a can be performed to remove the surface protrusion 244 from the layer 246. However the grain boundary 242 in layer 246 remains. A doped polycrystalline layer 150 is deposited over the intrinsic polycrystalline layer 148. The polycrystalline layer 246 can act as a seed layer to form a polycrystalline intrinsic layer 248 and a doped polycrystalline layer 250. The formation of the polycrystalline intrinsic layer 248 and the doped polycrystalline layer 250 propagates the grain boundary 242' through the layers 248 and 250. The doped polycrystalline layer 250 can include doped polysilicon. The polycrystalline intrinsic layer 248 and the doped polycrystalline layer 250 can be deposited at low temperatures (since the underlying polycrystalline structure acts as a template for the crystallinity). The polycrystalline layers 248 and 250 can be deposited using, e.g., PECVD.

Layer 250 is annealed with pulsed laser, flash lamp, or other technique, so that doping diffusion along the grain boundary creates a local shunt (52 in FIG. 5). The local shunts 52 are then utilized to permanently disable the corresponding PCM elements 18 in FIG. 1.

Figure 12:
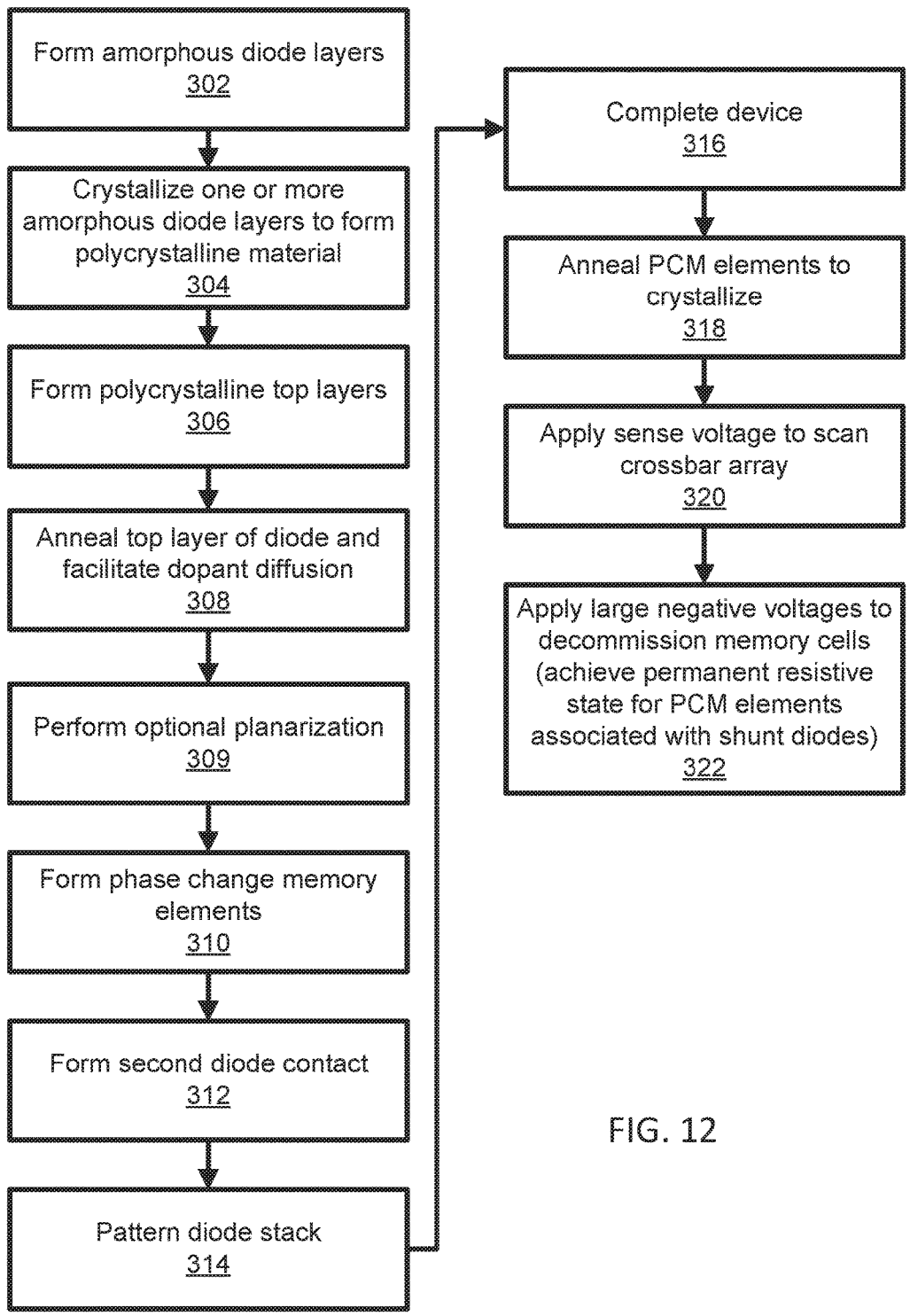
FIG. 12 is a block/flow diagram showing methods for deactivating memory cells affected by the presence of grain boundaries in selection devices in accordance with embodiments of the present invention.

Referring to FIG. 12, a block/flow diagram depicts methods for effectively removing memory cells impacted by the presence of grain boundaries in selection devices, in accordance with the present embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, one or more amorphous material layers are formed on a metal layer. Other layers may be present such as a semiconductor substrate, ILD layers, etc.

In block 304, one or more amorphous material layers can be crystallized to form polycrystalline material in a diode stack. The diode stack can include, e.g., an n-i-p structure, a p-i-n structure or other suitable structure. The crystallizing of the one or more amorphous material layers can be performed using laser treatment, e.g., excimer laser anneal (ELA).

In block 306, a top layer of the diode is formed using a plasma enhanced chemical vapor deposition process below 450 degrees C. The top layer can be grown as a polycrystalline structure using the underlying crystallized layer as a template, e.g., in an epitaxial manner.

In block 308, the top layer of the diode stack can be annealed. Grain boundaries caused by crystallizing the polycrystalline material become a source of shunts for the diodes. The formation of grain boundaries may be accompanied by the formation of surface roughness or surface protrusions in the polycrystalline material of the diode. In some embodiments, the surface roughness or protrusions may contribute to the formation of shunts. Dopant diffusion along grain boundaries (e.g., due to the anneal, normal diffusion or other mechanism) can further the development of the shunts.

In block 309, an optional planarization step can be performed to remove roughness from a lower doped layer and/or the intrinsic layer, if needed.

In block 310, phase change memory (PCM) cells are formed on top of the diode stack. In other embodiments, the PCM elements can be formed prior to the formation of the diodes.

In block 312, a second contact layer can be formed on the diode stack. The metal layer and the contact layer can include the same metallizations the metal lines in the crossbar array. Alternately, the metallizations of the array and the contacts/metal; layer can include different metal layers.

In block 314, the diode stack, PCM elements and second contacts can be patterned to form selection diodes connected with PCM elements and between metal lines in a crossbar array. The diodes and PCM elements are isolated from adjacent devices by passivation.

In block 316, the device is completed, e.g., back end of the line (BEOL) processing. The crossbar array may be formed before, during or after the diodes and the PCM elements. In particular, in some embodiments (e.g., FIG. 6), the PCM may be deposited prior to the patterning of the diode stack, followed by patterning the PCM and the diode stack using the same mask to form PCM/diode cells, and finally passivation to isolate the PCM/diode cells.

In block 318, the crossbar array is annealed at elevated temperatures to bring all the PCM elements into their low-resistance (e.g., crystalline) states. Elevated temperatures can be, e.g., greater than 100 degrees C. for GeSbTe.

In block 320, the array is scanned using a small negative sense voltage (e.g., less than one volt) to identify the locations (row numbers and column numbers) of the memory cells containing shunted diodes.

In block 322, the identified memory cells are decommissioned from use by applying large negative voltages (e.g., a bias voltage greater than 2 volts) to phase change memory elements connected to shunted diodes. By applying a second voltage larger than the sense voltages to the phase change memory elements gated by shunted selection diodes, the phase change memory elements gated by the shunted diodes achieve a permanently high resistive state.

Having described preferred embodiments phase change memory array with integrated polycrystalline diodes (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for deactivating memory cells affected by the presence of grain boundaries in polycrystalline selection devices, comprising:
    crystallizing at least one semiconductor layer in a diode stack to form a polycrystalline layer for selection diodes formed in a crossbar array;
    annealing to achieve a crystalline state in phase change memory elements coupled to corresponding selection diodes;
    identifying memory cells having shunted selection diodes due to grain boundaries by scanning the array using sense voltages; and
    applying a second voltage larger than the sense voltages to the phase change memory elements gated by the shunted selection diodes such that the phase change memory elements gated by the shunted diodes achieve a permanently high resistive state.

2. The method as recited in claim 1, wherein the shunts present in the shunted selection diodes are created by diffusing dopants across the grain boundaries using a laser.

3. The method as recited in claim 1, wherein crystallizing includes employing a laser.

4. The method as recited in claim 1, wherein a top layer of the one or more amorphous material layers is formed using a plasma enhanced chemical vapor deposition process below 450 degrees C.

5. The method as recited in claim 4, wherein the top layer is grown epitaxially.

6. The method as recited in claim 4, wherein the top layer has hydrogen content in the range of 5 to 40 atomic percent.

7. The method as recited in claim 1, further comprising annealing a top layer of the diode stack.

8. The method as recited in claim 1, wherein applying a second voltage larger than the sense voltages includes:
    applying a bias voltage between a corresponding column line and a corresponding row line of an identified shunted selection diode.

9. A method of deactivating memory cells affected by the presence of grain boundaries in polycrystalline selection devices, comprising:
    forming one or more amorphous material layers on a metal layer;
    crystallizing at least one of the one or more amorphous material layers to form polycrystalline material in a diode stack;
    facilitating dopant diffusion across grain boundaries of the polycrystalline material to create shunts across the grain boundaries;
    forming phase change memory material within the diode stack;
    forming a second contact layer on the diode stack;
    patterning the diode stack and the phase change memory material to form selection diodes and phase change memory elements connected between metal lines in a crossbar array;
    annealing to achieve a crystalline state in the phase change memory elements;
    identifying memory cells having shunted diodes by scanning the array using smaller negative sense voltages; and
    applying larger negative voltages to the phase change memory elements gated by the shunted selection diodes such that the phase change memory elements gated by the shunted diodes achieve a permanently high resistive state.

10. The method as recited in claim 9, wherein facilitating dopant diffusion across the grain boundaries includes using a laser.

11. The method as recited in claim 9, wherein crystallizing includes crystallizing the at least one of the one or more amorphous material layers to form polycrystalline material using a laser.

12. The method as recited in claim 9, wherein a top layer of the one or more amorphous material layers is formed using a plasma enhanced chemical vapor deposition process below 450 degrees C.

13. The method as recited in claim 12, further comprising annealing the top layer.

14. The method as recited in claim 12, wherein the top layer is grown epitaxially.

15. The method as recited in claim 12, wherein the top layer has hydrogen content in the range of 5 to 40 atomic percent.

16. The method as recited in claim 9, wherein applying larger negative voltages includes:
    applying a bias voltage between a corresponding column line and a corresponding row line to of an identified shunted selection diode.

* * * * *